US012235142B2

(12) United States Patent
Cirillo et al.

(10) Patent No.: US 12,235,142 B2
(45) Date of Patent: Feb. 25, 2025

(54) MEASUREMENT DEVICE AND METHOD FOR CONTROLLING THE SAME

(71) Applicant: Rohde & Schwarz GmbH & Co. KG, Munich (DE)

(72) Inventors: Luke Cirillo, Poing (DE); Andreas Lagler, Rosenheim (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 947 days.

(21) Appl. No.: 16/016,075

(22) Filed: Jun. 22, 2018

(65) Prior Publication Data
US 2019/0265079 A1 Aug. 29, 2019

(30) Foreign Application Priority Data

Feb. 23, 2018 (EP) ..................................... 18158287

(51) Int. Cl.
| | |
|---|---|
| *G01D 7/00* | (2006.01) |
| *G01R 1/02* | (2006.01) |
| *G01R 13/02* | (2006.01) |
| *G06F 3/04812* | (2022.01) |
| *G06F 3/04842* | (2022.01) |
| *G06F 3/04845* | (2022.01) |
| *G06F 3/0485* | (2022.01) |
| *G06F 3/04883* | (2022.01) |
| *G06F 16/245* | (2019.01) |

(52) U.S. Cl.
CPC ............... *G01D 7/00* (2013.01); *G01R 1/025* (2013.01); *G01R 13/029* (2013.01); *G06F 3/04812* (2013.01); *G06F 3/04842* (2013.01); *G06F 3/04845* (2013.01); *G06F 3/0485* (2013.01); *G06F 3/04883* (2013.01); *G06F 16/245* (2019.01); *G06F 2203/04806* (2013.01)

(58) Field of Classification Search
CPC ........ G01D 7/00; G01R 1/025; G01R 13/029; G06F 16/245; G06F 2203/04806; G06F 3/04812; G06F 3/04842; G06F 3/04845; G06F 3/0485; G06F 3/04883
See application file for complete search history.

(56) References Cited

U.S. PATENT DOCUMENTS

| | | | |
|---|---|---|---|
| 6,947,043 B1* | 9/2005 | Klingman | .......... G01R 13/0236 345/208 |
| 2006/0269018 A1* | 11/2006 | Li | .......... H03D 3/007 375/343 |
| 2007/0027675 A1* | 2/2007 | Hertz | .......... G01R 23/16 704/200.1 |
| 2014/0215382 A1* | 7/2014 | Engel | .......... G06F 3/04883 715/784 |
| 2014/0236539 A1* | 8/2014 | Lehane | .......... G06F 17/00 702/190 |
| 2015/0015503 A1* | 1/2015 | Tomisaki | .......... G01R 23/16 345/173 |

(Continued)

*Primary Examiner* — Kyle R Quigley
(74) *Attorney, Agent, or Firm* — DITTHAVONG, STEINER & MLOTKOWSKI

(57) ABSTRACT

A measurement device is provided. The measurement device comprises a display configured to display a measurement trace, an analyzing unit configured to analyze a subset of measurement data represented by the measurement trace on the basis of at least one target measurement parameter, and a post-processing unit configured to search for the at least one target measurement parameter.

11 Claims, 6 Drawing Sheets

(56) References Cited

U.S. PATENT DOCUMENTS

| | | | |
|---|---|---|---|
| 2015/0026619 A1* | 1/2015 | Lee | G06F 3/0488 |
| | | | 715/769 |
| 2016/0070461 A1* | 3/2016 | Herbordt | G06F 3/0416 |
| | | | 345/178 |
| 2017/0030945 A1* | 2/2017 | Waldo | G01R 13/029 |

* cited by examiner

MEASUREMENT DEVICE AND METHOD FOR CONTROLLING THE SAME

PRIORITY

This application claims priority of European patent application EP 18 158 287.5 filed on Feb. 23, 2018, which is incorporated by reference herewith.

FIELD OF THE INVENTION

The invention relates to a method and program for controlling a measurement device and a measurement device especially comprising a display, an analyzing unit, and a post-processing unit.

BACKGROUND OF THE INVENTION

Generally, in times of an increasing number of applications employing electric circuitry, there is a growing need of a measurement device and a method for controlling the same in order to prove correct functioning of said circuitry in an efficient manner.

US 2014/0215382 A1 discloses a method of operating a first data processing system having a screen for responding to a vector gesture performed on that screen. The method includes estimating a direction and assuming an identity for the vector gesture prior to the vector gesture being completed. As a consequence of said estimation and assumption, the disclosed data processing system may be operated in an inaccurate and inefficient manner, which may cost additional time due to required corrections.

There is a need to provide a measurement device and a method and program for controlling the same in order to test electric circuitry in an efficient and time-saving manner.

SUMMARY OF THE INVENTION

According to a first aspect of the invention, a method for controlling a measurement device is provided. The method comprises the steps of displaying a measurement trace on a display of the measurement device, analyzing a subset of measurement data represented by the measurement trace on the basis of at least one target measurement parameter, and searching for the at least one target measurement parameter. Advantageously, measurements can be performed in an efficient and time-saving manner.

According to a first preferred implementation form of the first aspect, the subset of measurement data is determined on the basis of at least one user measurement parameter set by at least one user input. Advantageously, measurement efficiency is further increased due to the fact that the necessary information is reduced to a minimum.

According to a further preferred implementation form of the first aspect, the at least one user input comprises at least one of a keyboard input, a mouse input, a touch gesture, and a voice control command. Advantageously, a variety of user input capabilities adapted to the respective use case is provided.

According to a further preferred implementation of the first aspect, the at least one user measurement parameter comprises at least one of bandwidth, center frequency, acquisition time, trigger offset, level, or any combination thereof. Advantageously, a variety of user measurement parameters adapted to the respective use case is provided.

According to a further preferred implementation form of the first aspect, the method further comprises the step of automatically setting the at least one target measurement parameter in the display of the measurement device. Advantageously, the measurement settings can be snapped.

According to a further preferred implementation form of the first aspect, the at least one target measurement parameter comprises at least one of target bandwidth, target center frequency, target acquisition time, target trigger offset, level, or any combination thereof. Advantageously, the measurement settings can be snapped with special respect to a variety of target measurement parameters adapted to the respective use case.

According to a further preferred implementation form of the first aspect, the method further comprises the step of setting the at least one target measurement parameter on the basis of at least one reasonable analysis result especially in the form of synchronization, error vector magnitude, preferably minimized error vector magnitude, maximum correlation, power maximum, or any combination thereof. Advantageously, efficiency is further increased.

According to a further preferred implementation form of the first aspect, the method further comprises the step of deriving the at least one target measurement parameter from the at least one user measurement parameter.

Advantageously, in this manner, measurement efficiency can further be increased.

According to a second aspect of the invention, a measurement device is provided. The measurement device comprises a display configured to display a measurement trace, an analyzing unit configured to analyze a subset of measurement data represented by the measurement trace on the basis of at least one target measurement parameter, and a post-processing unit configured to search for the at least one target measurement parameter. Advantageously, measurements can be performed in an efficient and time-saving manner.

According to a first preferred implementation form of the second aspect, the subset of measurement data is determined on the basis of at least one user measurement parameter set by at least one user input. Advantageously, measurement efficiency is further increased due to the fact that the necessary information is reduced to a minimum.

According to a further preferred implementation form of the second aspect, the at least one user input comprises at least one of a keyboard input, a mouse input, a touch gesture, and a voice control command. Advantageously, a variety of user input capabilities adapted to the respective use case is provided.

According to a further preferred implementation form of the second aspect, the at least one user measurement parameter comprises at least one of bandwidth, center frequency, acquisition time, trigger offset, level, or any combination thereof. Advantageously, a variety of user measurement parameters adapted to the respective use case is provided.

According to a further preferred implementation form of the second aspect, the analyzing unit is further configured to automatically set the at least one target measurement parameter in the display of the measurement device. Additionally or alternatively, the post-processing unit is further configured to automatically set the at least one target measurement parameter in the display of the measurement device. Advantageously, the measurement settings can be snapped.

According to a further preferred implementation form of the second aspect, the at least one target measurement parameter comprises at least one of target bandwidth, target center frequency, target acquisition time, target trigger offset, level, or any combination thereof. Advantageously, the measurement settings can be snapped with special respect to a variety of target measurement parameters adapted to the respective use case.

According to a further preferred implementation form of the second aspect, the analyzing unit is further configured to set the at least one target measurement parameter on the basis of at least one reasonable analysis result especially in the form of synchronization, error vector magnitude, preferably minimized error vector magnitude, maximum correlation, power maximum, or any combination thereof. Additionally or alternatively, the post-processing unit is further configured to set the at least one target measurement parameter on the basis of at least one reasonable analysis result especially in the form of synchronization, error vector magnitude, preferably minimized error vector magnitude, maximum correlation, power maximum, or any combination thereof. Advantageously, efficiency is further increased.

According to a further preferred implementation form of the second aspect, the analyzing unit is further configured to derive the at least one target measurement parameter from the at least one user measurement parameter. Additionally or alternatively, the post-processing unit is further configured to derive the at least one target measurement parameter from the at least one user measurement parameter. Advantageously, in this manner, measurement efficiency can further be increased.

BRIEF DESCRIPTION OF THE DRAWINGS

Exemplary embodiments of the invention are now further explained with respect to the drawings by way of example only, and not for limitation. In the drawings.

DETAILED DESCRIPTION OF PREFERRED EMBODIMENTS

Figure 1:
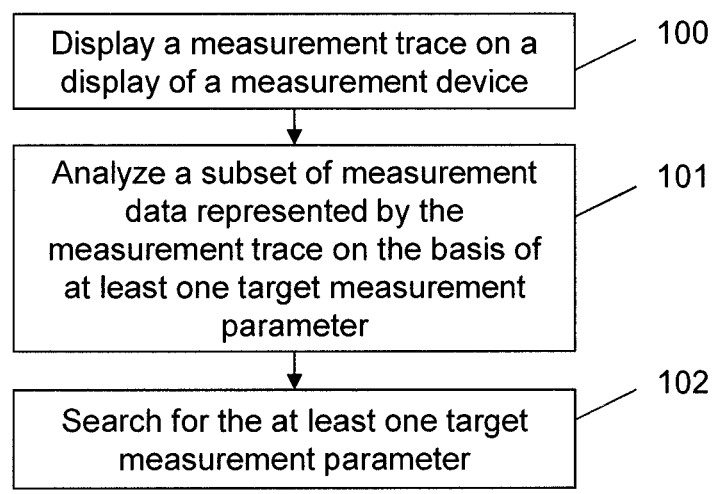
FIG. 1 shows a flow chart of an exemplary embodiment of the first aspect of the invention.

FIG. 1 shows a flow chart of the inventive method. In a first step 100, a measurement trace is displayed on a display of a measurement device. In a second step 101, a subset of measurement data represented by the measurement trace is analyzed on the basis of at least one target measurement parameter. Then, in a third step 102, it is searched for the at least one target measurement parameter.

Furthermore, the subset of measurement data may be determined on the basis of at least one user measurement parameter set by at least one user input.

In addition to this, the at least one user input may especially comprise at least one of a keyboard input, a mouse input, a touch gesture, and a voice control command.

Moreover, it may be particularly advantageous if the at least one user measurement parameter comprises at least one of bandwidth, center frequency, acquisition time, trigger offset, level, or any combination thereof.

Additionally, the method may further comprise the step of automatically setting the at least one target measurement parameter in the display of the measurement device.

In this context, it may be particularly advantageous if the at least one target measurement parameter comprises at least one of target bandwidth, target center frequency, target acquisition time, target trigger offset, level, or any combination thereof.

It may be further advantageous if the method additionally comprises the step of setting the at least one target measurement parameter on the basis of at least one reasonable analysis result especially in the form of synchronization, error vector magnitude, preferably minimized error vector magnitude, maximum correlation, power maximum, or any combination thereof.

In addition to this, the method may further comprise the step of deriving the at least one target measurement parameter from the at least one user measurement parameter.

Figure 2:
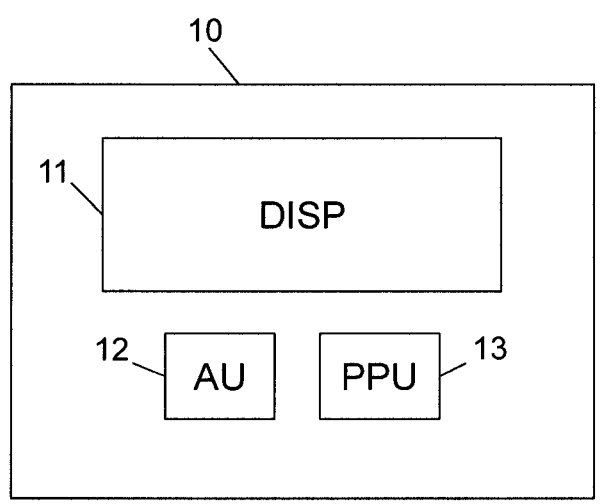
FIG. 2 shows an exemplary embodiment of a measurement device according to the second aspect of the invention.

Furthermore, FIG. 2 shows a block diagram of an exemplary embodiment of a measurement device 10 according to the second aspect of the invention.

Said measurement device 10 comprises a display 11 configured to display a measurement trace, an analyzing unit 12 configured to analyze a subset of measurement data represented by the measurement trace on the basis of at least one target measurement parameter, and a post-processing unit 13 configured to search for the at least one target measurement parameter.

It may be particularly advantageous if the display 11 provides pan functionality and/or zoom functionality with special respect to the adjustment of measurement settings of the measurement device 10. In this context, further advantageously, the analyzing unit 12 and/or the post-processing unit 13 may be configured to execute a calculation, preferably in parallel while said measurement settings are adjusted, in order to check if certain criteria are fulfilled by the current measurement settings. If said criteria are fulfilled, the measurement settings are snapped. In other words, the analyzing unit 12 and/or the post-processing unit 13 may be configured to lock the measurement settings to specific values which fulfill the criteria.

In this context, it is noted that it is particularly advantageous if after having used the pan functionality and/or the zoom functionality, wherein the respective pan command and/or zoom command, preferably the respective pan gesture and/or zoom gesture, moves further than a significant amount, preferably exceeds a certain limit, the free adjustment of the measurement settings via user inputs, preferably via touch gestures with special respect to the display 11, will be continued.

In addition to this, the subset of measurement data may be determined on the basis of at least one user measurement parameter set by at least one user input.

Furthermore, the at least one user input may comprise at least one of a keyboard input, a mouse input, a touch gesture, and a voice control command.

Moreover, the at least one user measurement parameter may comprise at least one of bandwidth, center frequency, acquisition time, trigger offset, level, or any combination thereof.

With respect to the above-mentioned snap functionality, the analyzing unit 12 may further be configured to automatically set the at least one target measurement parameter in the display 11 of the measurement device 10. Additionally or alternatively, the post-processing unit 13 is further configured to automatically set the at least one target measurement parameter in the display 11 of the measurement device 10.

In this context, it may be particularly advantageous if the at least one target measurement parameter comprises at least one of target bandwidth, target center frequency, target acquisition time, target trigger offset, level, or any combination thereof.

Further advantageously, the analyzing unit 12 may further be configured to set the at least one target measurement parameter on the basis of at least one reasonable analysis result especially in the form of synchronization, error vector magnitude, preferably minimized error vector magnitude, maximum correlation, power maximum, or any combination thereof. Additionally or alternatively, the post-processing unit 13 may further be configured to set the at least one target measurement parameter on the basis of at least one reasonable analysis result especially in the form of synchronization, error vector magnitude, preferably minimized error vector magnitude, maximum correlation, power maximum, or any combination thereof.

Additionally, the analyzing unit 12 may further be configured to derive the at least one target measurement parameter from the at least one user measurement parameter. Additionally or alternatively, the post-processing unit 13 may further be configured to derive the at least one target measurement parameter from the at least one user measurement parameter.

In addition to all the explanations above, the invention should especially be discussed with respect to the following exemplary use cases:

As a first example, a user can pan and/or zoom to adjust center frequency and/or bandwidth in the case that a spectrum display is given. While this is happening, a synchronization routine especially runs on each new setting and especially attempts to lock onto the frequency preferably via correlation with a reference waveform or recovery of a modulated signal symbol rate or a combination thereof. In this context, the analyzing unit 12 and/or the post-processing unit 13 may be configured to execute said synchronization routine.

As a second example, the user can pan and/or zoom to adjust trigger offset and/or measurement time in the case that a magnitude display is given. While this is happening, a synchronization routine especially runs on each new setting and especially attempts to lock on the signal location in time preferably via correlation with a reference waveform or a burst detection algorithm or a combination thereof. In this context, the analyzing unit 12 and/or the post-processing unit 13 may be configured to execute said synchronization routine.

In another variation of the invention, especially with the aid of the analyzing unit 12, analysis may be performed preferably over an available time and/or bandwidth in order to find possible snap positions, preferably positions at which the measurement settings can be locked to the specific values which fulfill the certain criteria as already discussed above. Preferably, the analyzing unit 12 may further be configured to find these snap positions especially in advance. Furthermore, especially with the aid of the display 11, said snap positions may graphically be displayed. Preferably, when the user adjusts the display to be close to one of the specific values, the snap effect will be applied. In addition to this, directly selecting a possible snap position, preferably by a double tap on the display 11 especially providing touchscreen functionality, may also jump to that setting.

In a further variation, performing a touch gesture, preferably a double tap, with respect to the display 11 especially providing touchscreen functionality, may cause a search for signal analysis to be preferably performed in a localized region around the position of the touch action. Said signal analysis may especially be performed with the aid of the analyzing unit 12 and/or the post-processing unit 13. For instance, a double tap on the display 11 close to a spectral peak may especially cause a frequency search for synchronization to be performed close to that location. Additionally, in the following, the center frequency may preferably be set to the respective synchronization frequency in the case that a respective synchronization frequency has been found.

Figure 3:
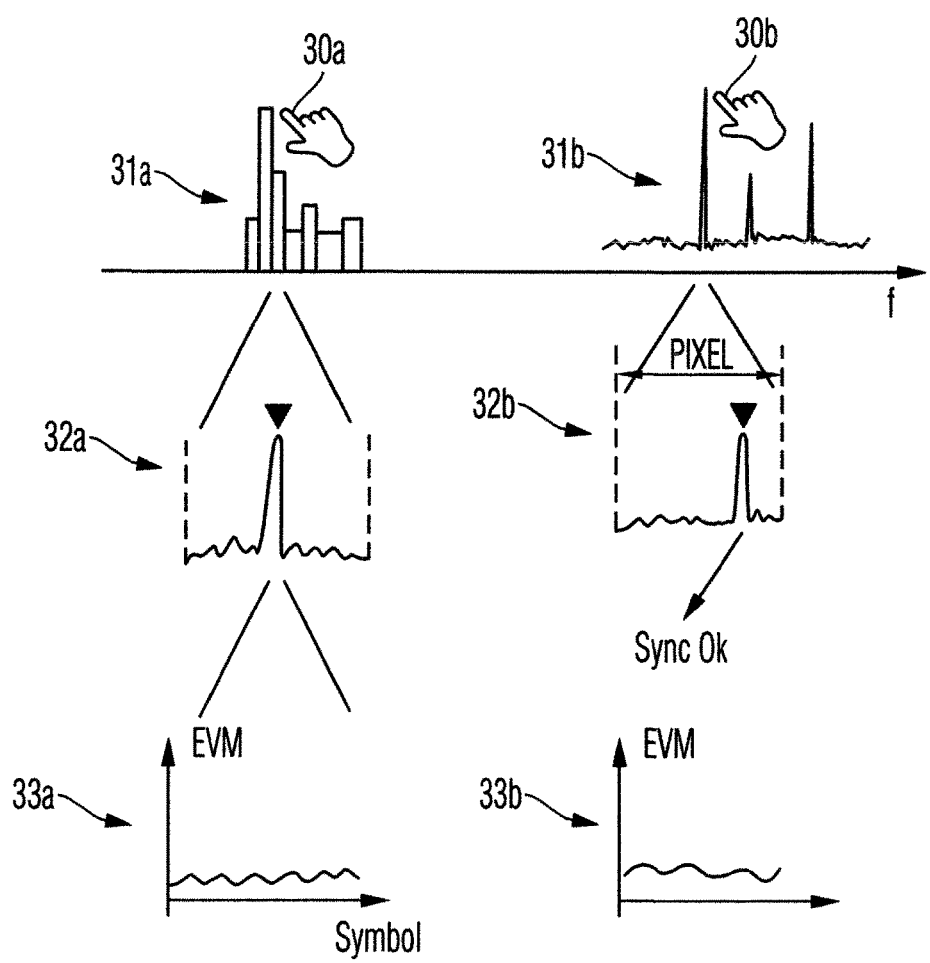
FIG. 3 shows an exemplary frequency display.

Now, with respect to FIG. 3, an exemplary frequency display is shown. A first signal 31a is displayed on a display especially providing touchscreen functionality. A touch gesture with the aid of a finger 30a may lead to selection of a certain frequency as marked in the magnified representation 32a of said first signal. In this exemplary case, due to the fact that the representation 31a of the first signal is not too small for the finger 30a, the desired frequency can be selected without corrections performed by the above-mentioned synchronization routine. In addition to this, a representation 33a of the error vector magnitude with respect to the symbols of the first signal 31a is also depicted in FIG. 3.

Furthermore, according to FIG. 3, a second signal 31b is displayed on the display with touchscreen functionality. A touch gesture with the aid of a finger 30b may lead to selection of a certain frequency as marked in the magnified representation 32b of said second signal. As it can be seen, said magnified representation 32b comprises just one pixel of the display. In this exemplary case, due to the fact that the representation 31b of the second signal is too tenuous for the finger 30b, the desired frequency has to be selected with the aid of the above-mentioned synchronization routine, which is illustrated by "Sync Ok". In addition to this, a representation 33b of the error vector magnitude with respect to the symbols of the second signal 31b is also shown in FIG. 3.

Figure 4:
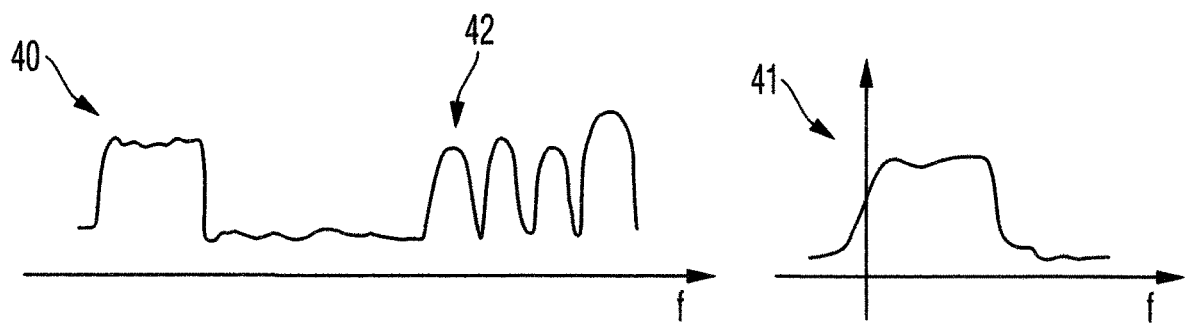
FIG. 4 shows an exemplary representation of a signal in frequency domain and time domain.
Figure 6:
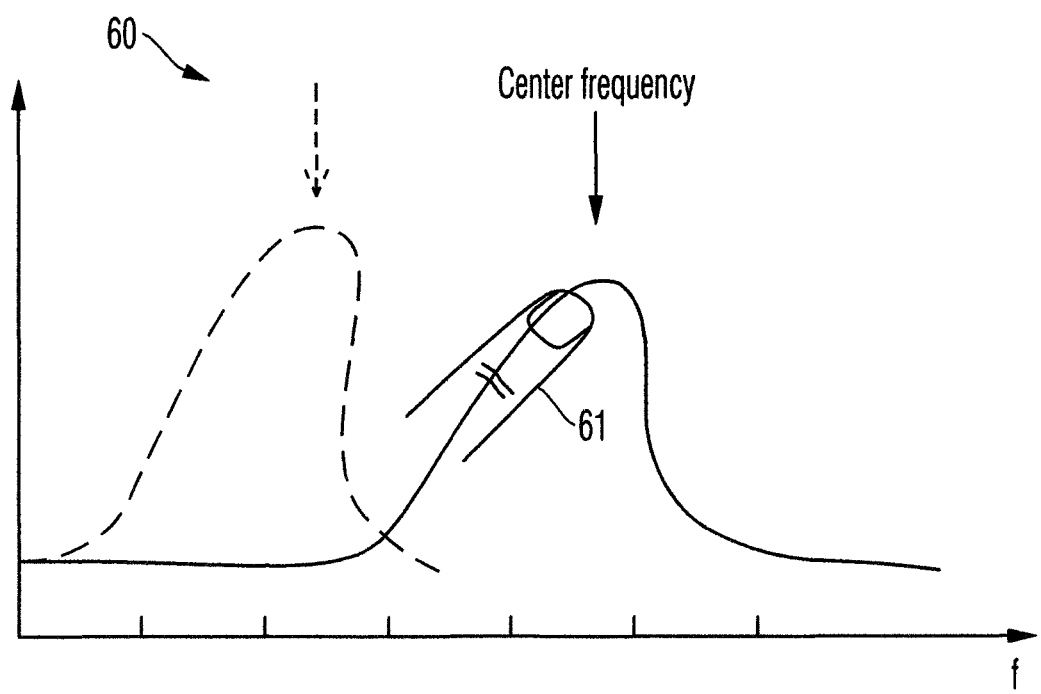
FIG. 6 shows an exemplary frequency display, wherein the center frequency has been panned.

Moreover, FIG. 4 shows an exemplary representation 40 of a signal in frequency domain, wherein a certain frequency 42 has been marked. Preferably, the display on which said representation 40 is shown may provide touchscreen functionality. In this case, the bandwidth may especially be adjusted with the aid of touch gestures, preferably pinching and/or stretching, whereas especially the center frequency may be adjusted by panning. It is noted that said pan gesture is exemplarily illustrated by FIG. 6 showing a frequency display 60, wherein the center frequency is panned with the aid of a finger 61.

Figure 5:
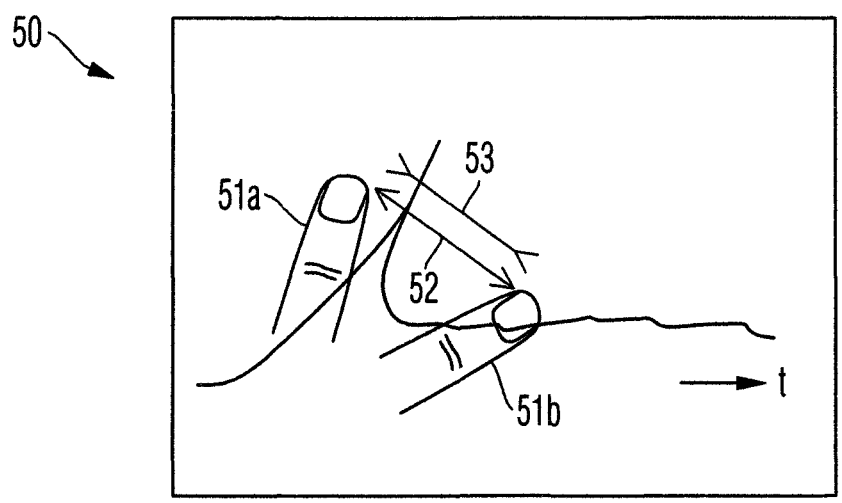
FIG. 5 shows the influence of pinching and stretching with respect to acquisition time.

In addition to this, FIG. 4 also depicts an exemplary representation 41 in time domain. Preferably, the display on which said representation 41 is shown may provide touchscreen functionality. In this case, the acquisition time may especially be adjusted with the aid of touch gestures, preferably pinching and/or stretching, whereas especially the trigger offset may be adjusted by panning. It is noted that said pinching and/or stretching gesture is exemplarily illustrated by FIG. 5 showing the influence of pinching 53 and stretching 52 with the aid of two fingers 51a, 51b with respect to acquisition time.

Figure 7:
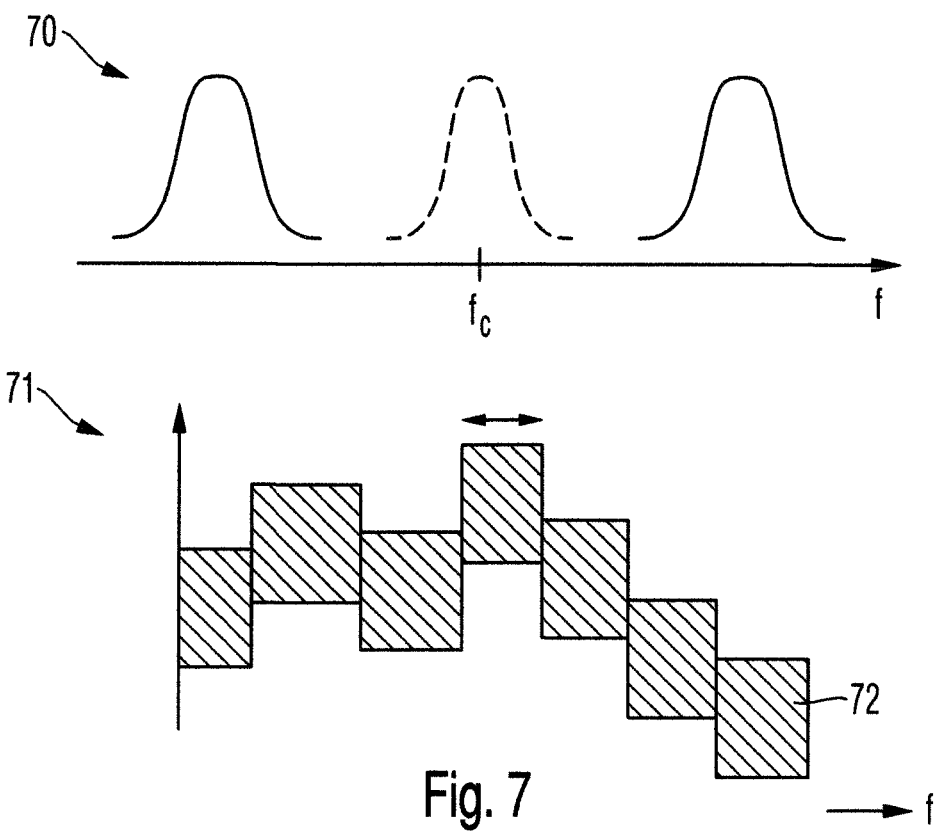
FIG. 7 shows an exemplary frequency display and a magnified representation thereof.

Furthermore, FIG. 7 shows an exemplary frequency display and a magnified representation 71 thereof, wherein pixels such as pixel 72 can be seen.

Figure 8:
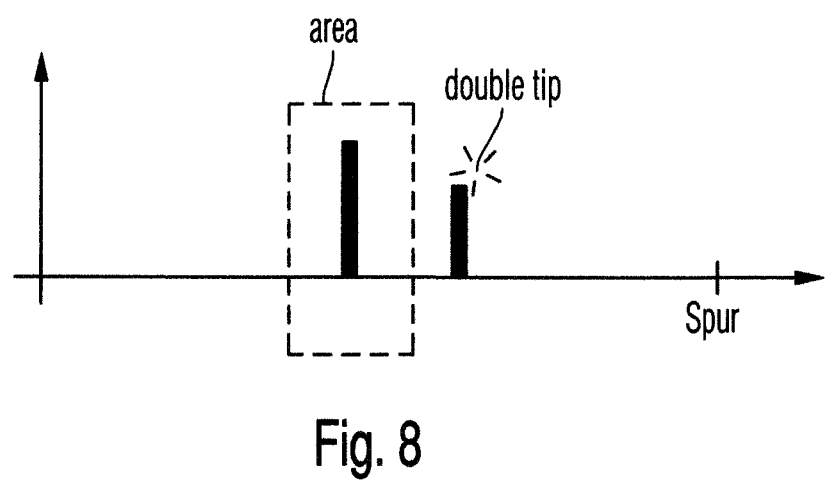
FIG. 8 shows an exemplary frequency display with special respect to signal analysis performed in a certain area.

Now, with respect to FIG. 8, an exemplary frequency display with special respect to signal analysis performed in a certain area is depicted.

In this context, as already described above, performing a touch gesture, preferably a double tap such as shown in FIG. 8, with respect to the frequency display especially providing touchscreen functionality, may cause a search for signal analysis to be preferably performed in a localized region or certain area as depicted, respectively, around the position of the touch action. For instance, a double tap on the frequency display close to a spectral peak may especially cause a frequency search for synchronization to be performed close to that location. Additionally, in the following, the center frequency may preferably be set to the respective synchronization frequency in the case that a respective synchronization frequency has been found.

Figure 9:
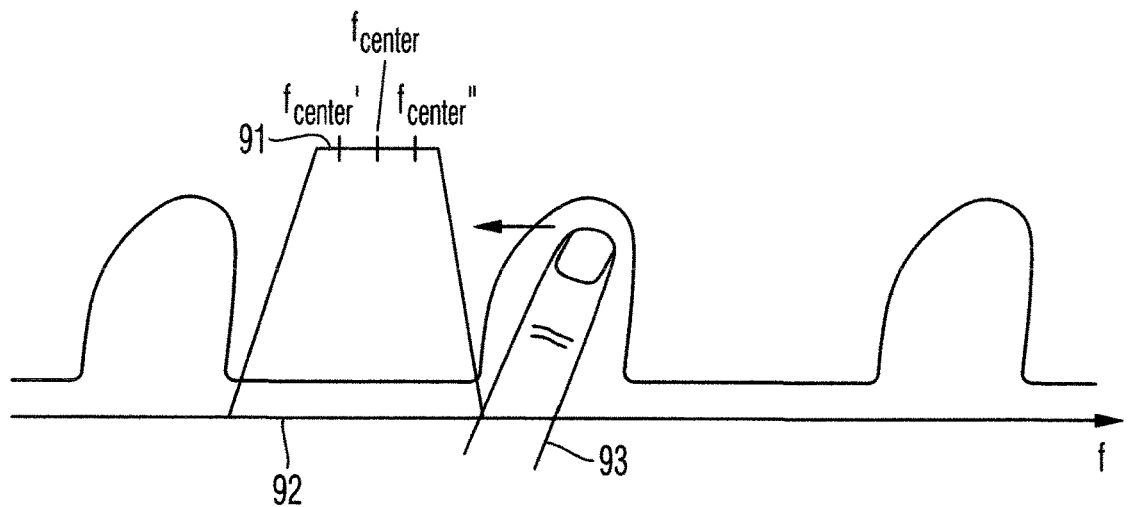
FIG. 9 shows an exemplary frequency display with special respect to center frequency and demodulation.

Moreover, FIG. 9 shows a further exemplary frequency display, wherein the signal is panned with the aid of a finger 93 with respect to a demodulation filter 91. In addition to this, the quantization raster 92 is also illustrated by FIG. 9.

Figure 10:
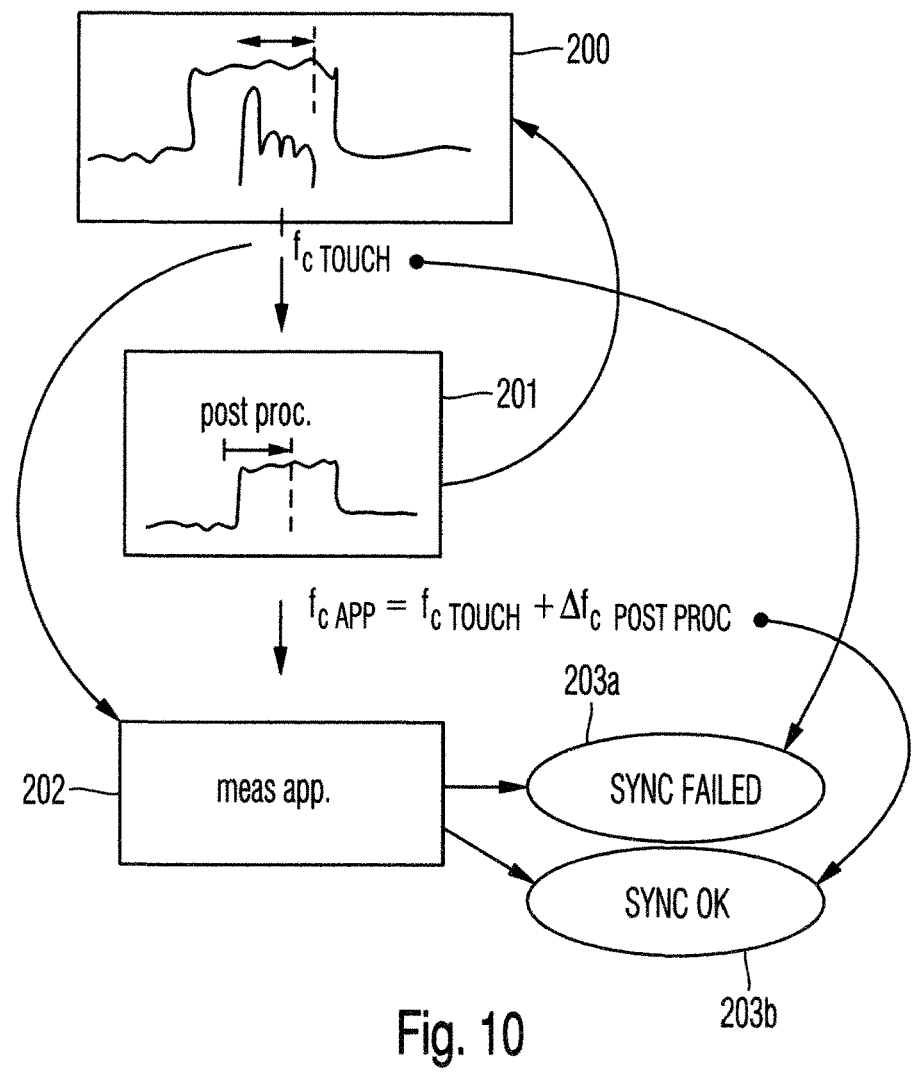
FIG. 10 shows an exemplary flow chart of a synchronization routine.

Finally, FIG. 10 depicts a flow chart of the above-mentioned synchronization routine. In a first step 200, a center frequency is selected with the aid of a touch gesture, which is represented by $f_{c,touch}$. Then, in a second step 201, a frequency correction value $\Delta f_{c,pp}$ is calculated especially with the aid of the post-processing unit 13. Furthermore, in a third step 202, the center frequency applied for measurement represented by $f_{c,app}$ is calculated according to the following equation: $f_{c,app}=f_{c,touch}+\Delta f_{c,pp}$. Moreover, in a fourth step providing two alternative ways 203a and 203b, it is determined whether the synchronization routine failed or the latter was successful.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A method for controlling a measurement device, wherein the method comprises the steps of:
   displaying a measurement trace on a touchscreen display of the measurement device,
   analyzing a subset of measurement data represented by the measurement trace on the basis of at least one target measurement parameter,
   searching for the at least one target measurement parameter,
   running a synchronization routine on measurement settings, wherein the synchronization routine attempts to lock on the target measurement parameter via correlation with a reference waveform and recovery of a modulated signal symbol rate in the case that a spectrum is displayed, or via correlation with a reference waveform and a burst detection algorithm in the case that a magnitude is displayed,
   executing a calculation, in parallel while the measurement settings are adjusted, in order to check if certain criteria are fulfilled by the current measurement settings,
   snapping the measurement settings, if said criteria are fulfilled,
   finding possible snap positions corresponding to the snapped measurement settings in advance by analyzing over an available time and/or bandwidth, and graphically displaying said snap positions,
   based on a double tap touch gesture with respect to the touchscreen display, causing a search for a signal analysis to be performed in a localized region around the position of the double tap touch gesture,
      wherein the double tap touch gesture comprises two successive touches,
      wherein the subset of measurement data is determined on the basis of at least one user measurement parameter set by at least one user input, and
      wherein the at least one user measurement parameter comprises at least one of bandwidth, acquisition time, or trigger offset.

2. The method according to claim 1, wherein the at least one user input comprises at least one of a keyboard input, a mouse input, a touch gesture, and a voice control command.

3. The method according to claim 1, wherein the method further comprises the step of automatically setting the at least one target measurement parameter in the display of the measurement device and/or wherein the method further comprises the step of setting the at least one target measurement parameter on the basis of at least one reasonable analysis result especially in the form of synchronization, error vector magnitude, minimized error vector magnitude, maximum correlation or power maximum.

4. The method according to claim 1, wherein the at least one target measurement parameter comprises at least one of target bandwidth, target center frequency, target acquisition time, target trigger offset or level.

5. The method according to claim 1, wherein the method further comprises the step of deriving the at least one target measurement parameter from the at least one user measurement parameter.

6. A measurement device comprising:
   a touchscreen display configured to display a measurement trace,
   an analyzing unit configured to analyze a subset of measurement data represented by the measurement trace on the basis of at least one target measurement parameter, and
   a post-processing unit configured to search for the at least one target measurement parameter,
   wherein a synchronization routine runs on measurement settings, wherein the synchronization routine attempts to lock on the target measurement parameter via correlation with a reference waveform and recovery of a modulated signal symbol rate in the case that a spectrum is displayed, or via correlation with a reference waveform and a burst detection algorithm in the case that a magnitude is displayed,
   wherein the analyzing unit and/or the post-processing unit is configured to execute a calculation, in parallel while the measurement settings are adjusted, in order to check if certain criteria are fulfilled by the current measurement settings, wherein the analyzing unit and/or the post-processing unit is configured to snap the measurement settings, if said criteria are fulfilled, wherein the analyzing unit is configured to find possible snap positions corresponding to the snapped measurement settings in advance by analyzing over an available time and/or bandwidth, whereby the display is configured to graphically display said snap positions, and based on a double tap touch gesture with respect to the touchscreen display, the analyzing unit is configured to cause a search for a signal analysis to be performed in a localized region around the position of the double tap touch gesture, wherein the double tap touch gesture comprises two successive touches, wherein the subset of measurement data is determined on the basis of at least one user measurement parameter set by at least one user input, and wherein the at least one user measurement parameter comprises at least one of bandwidth, acquisition time, or trigger offset.

7. The measurement device according to claim 6, wherein the at least one user input comprises at least one of a keyboard input, a mouse input, a touch gesture, and a voice control command and/or wherein the at least one user measurement parameter comprises at least one of bandwidth, center frequency, acquisition time, trigger offset or level.

8. The measurement device according to claim 6, wherein the analyzing unit is further configured to automatically set the at least one target measurement parameter in the display of the measurement device, and/or wherein the post-processing unit is further configured to automatically set the at least one target measurement parameter in the display of the measurement device.

9. The measurement device according to claim 6, wherein the at least one target measurement parameter comprises at least one of target bandwidth, target center frequency, target acquisition time, target trigger offset or level.

10. The measurement device according to claim 6, wherein the analyzing unit is further configured to set the at least one target measurement parameter on the basis of at least one reasonable analysis result especially in the form of synchronization, error vector magnitude, minimized error vector magnitude, maximum correlation or power maximum, and/or wherein the post-processing unit is further configured to set the at least one target measurement parameter on the basis of at least one reasonable analysis result especially in the form of synchronization, error vector magnitude, minimized error vector magnitude, maximum correlation or power maximum.

11. The measurement device according to claim 6, wherein the analyzing unit is further configured to derive the at least one target measurement parameter from the at least one user measurement parameter, and/or wherein the post-processing unit is further configured to derive the at least one target measurement parameter from the at least one user measurement parameter.

* * * * *